US009172242B2

(12) United States Patent
Chang et al.

(10) Patent No.: US 9,172,242 B2
(45) Date of Patent: Oct. 27, 2015

(54) ELECTROSTATIC DISCHARGE PROTECTION FOR THREE DIMENSIONAL INTEGRATED CIRCUIT

(71) Applicant: Taiwan Semiconductor Manufacturing Co., Ltd., Hsin-Chu (TW)

(72) Inventors: Tzu-Heng Chang, New Taipei (TW); Jen-Chou Tseng, Jhudong Township (TW); Ming-Hsiang Song, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 145 days.

(21) Appl. No.: 13/667,072

(22) Filed: Nov. 2, 2012

(65) Prior Publication Data

US 2014/0126089 A1    May 8, 2014

(51) Int. Cl.
*H02H 9/00*    (2006.01)
*H02H 9/04*    (2006.01)

(52) U.S. Cl.
CPC ..................... *H02H 9/046* (2013.01)

(58) Field of Classification Search
CPC ........................................... H02H 9/046

USPC ........................................................... 361/56
See application file for complete search history.

(56) References Cited

U.S. PATENT DOCUMENTS

| 6,724,603 B2 * | 4/2004 | Miller et al. ............... 361/111 |
| 2004/0141269 A1 * | 7/2004 | Kitagawa ..................... 361/56 |

* cited by examiner

*Primary Examiner* — Thienvu Tran
*Assistant Examiner* — Tien Mai
(74) *Attorney, Agent, or Firm* — Duane Morris LLP (57) ABSTRACT

The present disclosure provides a three dimensional integrated circuit having a plurality of dies. Each die includes a trigger line common to the other dies, the trigger line controlling the power of a power clamp in each respective die, a dedicated electrostatic discharge (ESD) line for each respective die, and an ESD detection circuit connected to the dedicated ESD line and to a first power line common to the other dies. When an input signal is received by the ESD detection circuit of one of the plural dies, the ESD detection circuit generates an output signal to the common trigger line to supply power to the power clamp in each of the plural dies to clamp ESD voltage or current to the common first power line or a second power line.

20 Claims, 10 Drawing Sheets

ELECTROSTATIC DISCHARGE PROTECTION FOR THREE DIMENSIONAL INTEGRATED CIRCUIT

BACKGROUND

Figure 8:
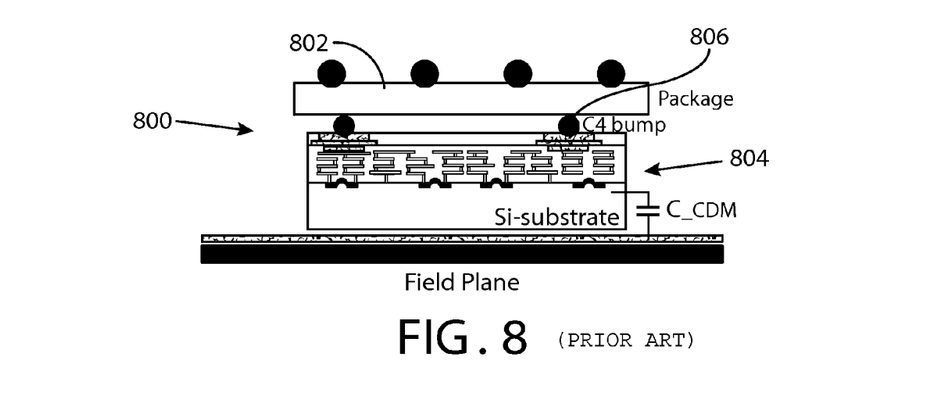
FIG. 8 is a schematic view of a conventional two-dimensional integrated circuit package.

The semiconductor industry has experienced continued rapid growth due to continuous improvements in the integration density of various electronic components. These integration improvements are generally two-dimensional (2D) in nature, that is, the volume occupied by the integrated components is essentially on the surface of the semiconductor wafer. FIG. 8 is a schematic view of a conventional 2D integrated circuit (IC) 800. With reference to FIG. 8, a semiconductor package 802 is connected to a die or chip 804 by way of solder balls or bumps 806. Those of skill in the art will readily recognize that other packaging materials can be connected to the package 802 in place of the chip 804. Further, the number of solder balls or bumps shown is only for illustrative purpose. Those of skill in the art will readily recognize that there are many variations which implement equivalent functions and the illustrative schematic view is made for illustrative purpose only. While improvements in lithography techniques have resulted in improvements in 2DIC formation, there are physical limits to the density that can be achieved in two dimensions.

Figure 9:
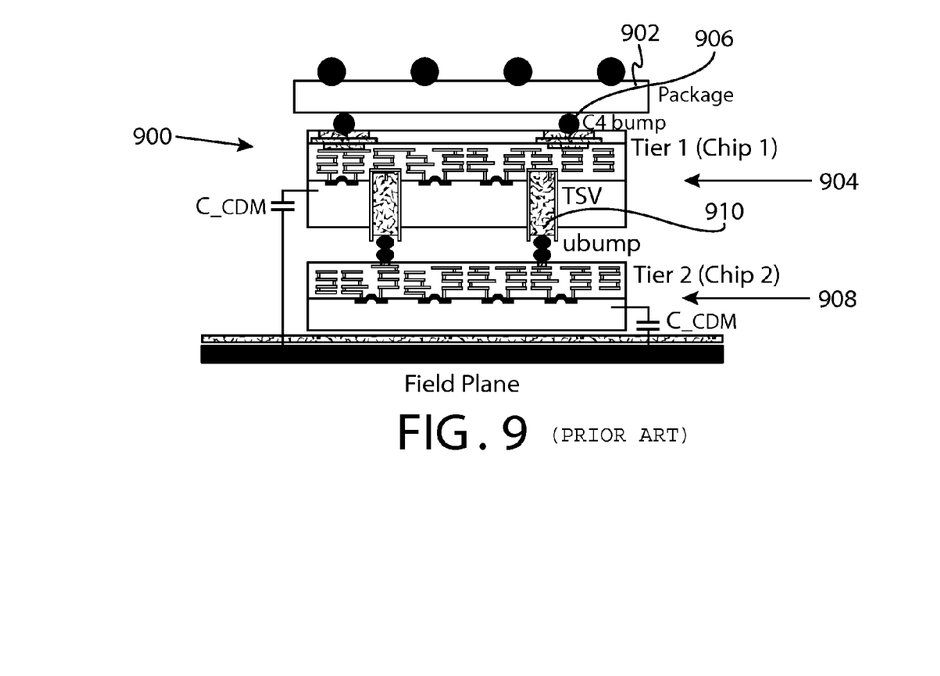
FIG. 9 is a schematic view of a conventional three-dimensional integrated circuit package.

Three-dimensional (3D) ICs resolve these physical limitations. A 3DIC is generally a semiconductor chip in which two or more layers of active electronic components are integrated both vertically and horizontally into a single circuit. FIG. 9 is a schematic view of a conventional 3DIC 900. With reference to FIG. 9, a semiconductor package 902 is connected to a tier 1 die or chip 904 by way of solder balls or bumps 906. The terms die and chip are used interchangeably herein and such use should not limit the scope of the claims appended herewith. The tier 1 chip 904 is then connected to a tier 2 chip 908 using through-substrate vias (TSVs) 910. In a typical formation process for a 3DIC, two wafers, each including an integrated circuit, are formed. The wafers are then bonded with the devices aligned. TSVs are formed to interconnect devices on the first and second substrates. In a die-on-wafer fabrication technique, electronic components are built on two semiconductor wafers. One wafer is diced, and the single dies are aligned and bonded onto die sites of the second wafer. Thinning and TSV creation are performed either before or after bonding, and additional dies can be added to the stacks before dicing. In a die-on-die fabrication technique, electronic components are built on multiple dies which are then aligned and bonded. Thinning and TSV creation are performed either before or after bonding. A 3DIC is a single chip whereby components on the respective layers communicate with on-chip signaling, vertically or horizontally. Using 3DIC technology, higher device density has been achieved than 2DIC technology. As a result of this increase in density, total wire length and number of vias are reduced.

Electrostatic discharge (ESD) is generally defined as a sudden and momentary electric current that flows between two objects at different electrical potentials. ESD can damage devices fabricated on IC chips causing performance degradation or failures. One of many considerations for IC design is on-chip ESD protection; however, due to the ever-increasing requirements for higher speeds, smaller devices and product reliability, the significance of on-chip ESD protection is critical in IC design. Conventional methods of ESD protection utilize 2DIC protection devices for a 3DIC. There are, however, too many power domains in a 3DIC to protect the chip from ESD using conventional 2DIC protection devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

The disclosure relates in general to a charge device (CDM) protection circuit that uses devices formed along and coupled with the working components of an integrated circuit (IC).

Figure 1:
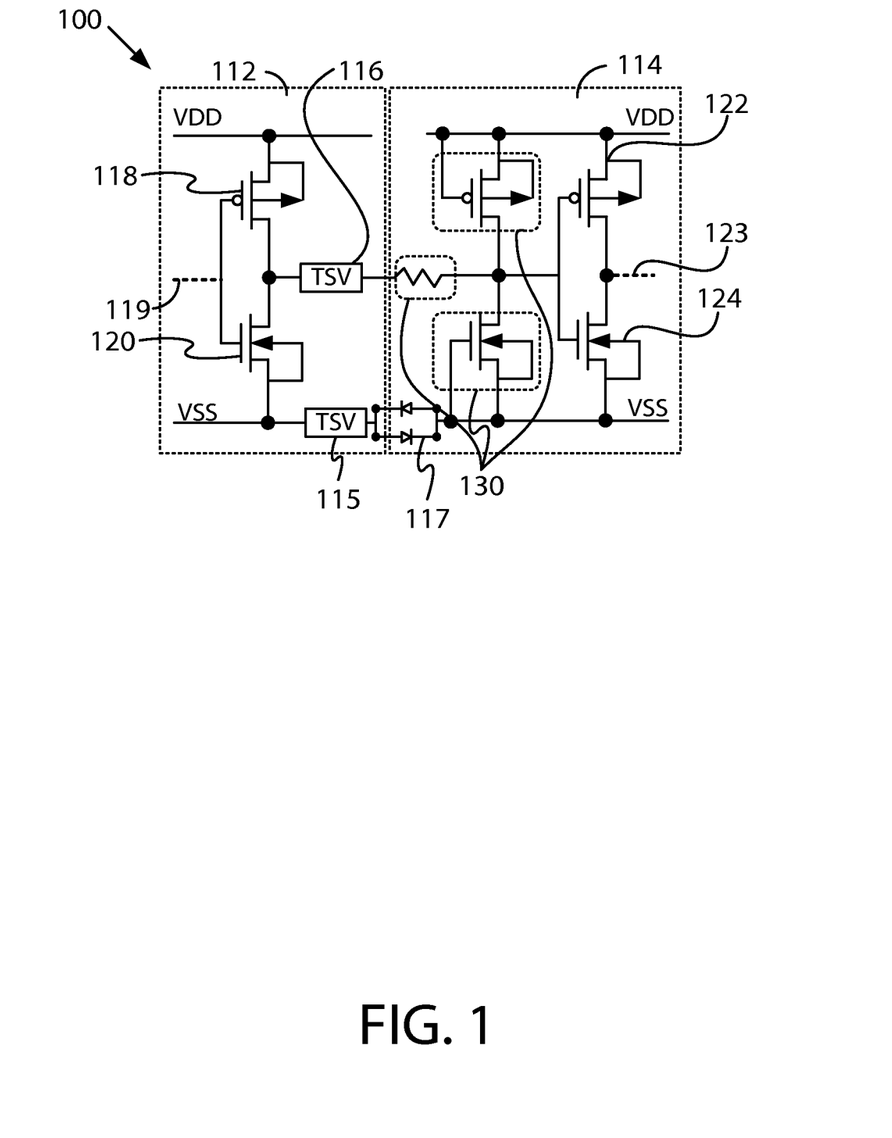
FIG. 1 is a schematic view of a three-dimensional integrated circuit package using a two-dimensional electrostatic discharge protection.

FIG. 1 is a schematic view of a three-dimensional (3D) IC package using two-dimensional (2D) IC electrostatic discharge (ESD) protection. With reference to FIG. 1, a 3DIC package 100 includes a first die 112 and a second die 114 using one or more through-substrate vias (TSVs) 115, 116 to interconnect components or devices on the first and second dies 112, 114. Additional dies and associated components can be included as indicated by dashed lines 119, 123. Components on the first die 112 include a p-channel metal oxide (PMOS) transistor 118 connected via its drain to a TSV 116 and a drain of a n-channel metal oxide (NMOS) transistor 120. These two components can be connected to additional components or dies as indicated by a dashed line 119. These components are supplied power by positive power line or bus VDD and negative power line or bus VSS. The terms bus and line are used interchangeably in this disclosure and such use should not limit the scope of the claims appended herewith. The VSS buses of the first and second die can be connected using a diode arrangement 117. The VDD buses, however, are not connected through the TSV 116 due to leakage concern during power-on of the 3DIC package 100. Components on the second die 114 include a PMOS transistor 122 connected via its drain to a drain of a NMOS transistor 124 and additional components or dies as indicated by a dashed line 123. These components are supplied power by power lines VDD and VSS. Using 2DIC ESD protection, a CDM protection device(s) on one of the dies, a master die, would be used to protect each die from an ESD event occurring on any of the dies. In the example illustrated in FIG. 1, the CDM protection devices 130 are included on the second die 114 and thus the second die 114 is termed as the master die or chip and the first die 112 and all other dies in this example are termed as a slave die or chip. The CDM protection device 130 includes an interconnected PMOS transistor, NMOS transistor and resistor connected to the TSV 116 and to the power lines VDD and VSS to effectively pull up a voltage to VDD and pull down a voltage to VSS. Using such a CDM protection device 130 would protect against an ESD event on one die rather than on all dies. That is, there are too many power domains in a 3DIC among master and slave chips and all CDM protection devices would need to simultaneously trigger to protect against an ESD event and current intra- and/or intra-chip.

Figure 2:
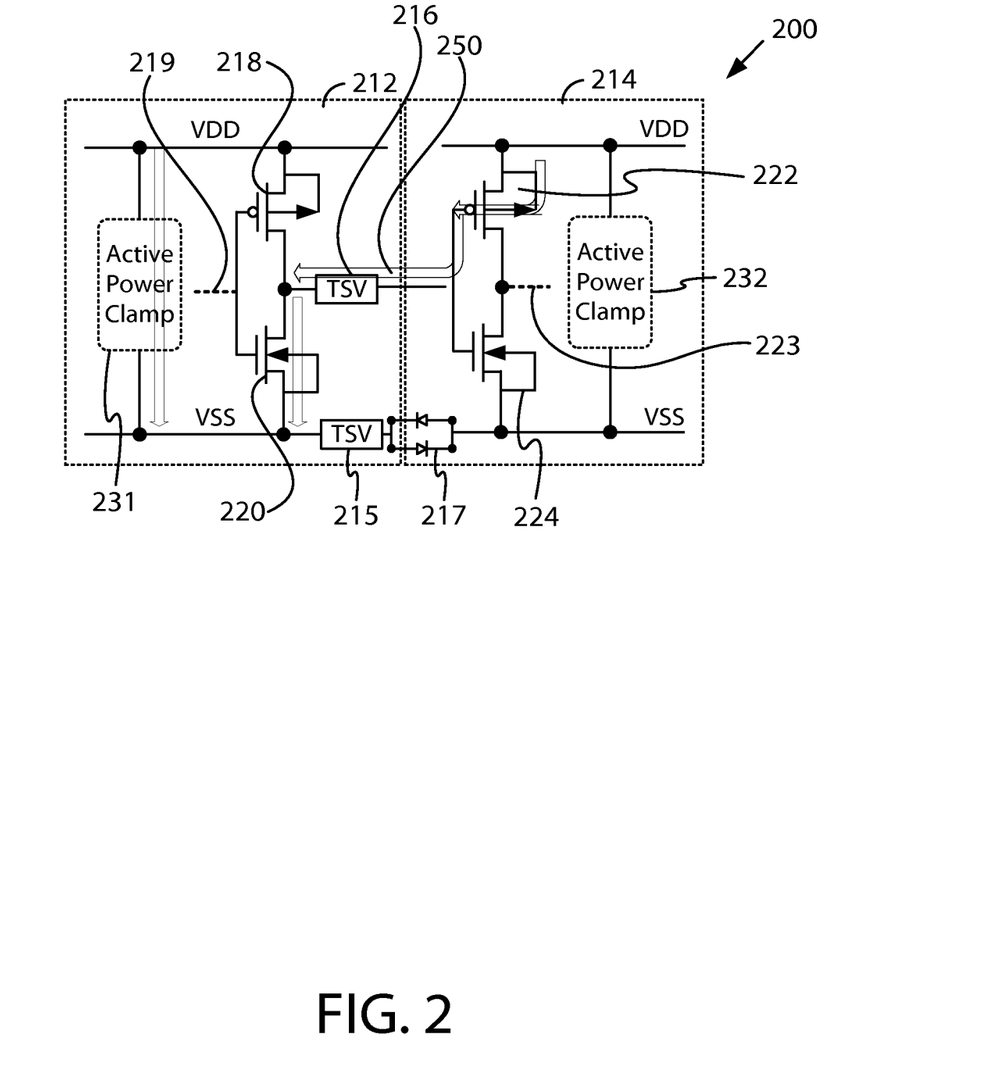
FIG. 2 is a schematic view of another three-dimensional integrated circuit package using two-dimensional electrostatic discharge protection.

FIG. 2 is a schematic view of another 3DIC package using 2DIC ESD. With reference to FIG. 2, a 3DIC package 200 includes a first die 212 and a second die 214 using one or more TSVs 215, 216 to interconnect components or devices on the first and second dies 212, 214. Components on the first die 212 include a PMOS transistor 218 connected via its drain to a TSV 216 and a drain of a NMOS transistor 220. These two components can be connected to additional components or dies as indicated by a dashed line 219. These components are supplied power by power lines VDD and VSS. Components on the second die 214 include a PMOS transistor 222 connected via its drain to a drain of a NMOS transistor 224 and additional components or dies as indicated by a dashed line 223. These components are supplied power by power lines VDD and VSS. The VSS buses of the first die 212 and second die 214 can be connected using a diode arrangement 217. The VDD buses, however, are not connected through the TSV 216 due to leakage concern during power-on of the 3DIC package 200. Using 2DIC ESD protection, CDM protection devices such as power clamps can be placed on both dies to protect each die from an ESD event. In the example illustrated in FIG. 2, the CDM protection devices 230, 231 on the first and second dies 212, 214, respectively, can include an ESD or active power clamp. Examples of such power clamps include, but are not limited to, dual direction ESD clamps. Such dual direction ESD clamps include, for example, dual back-to-back diodes, dual-directional silicon controlled rectifiers (SCR), NMOS devices, bipolar junction transistors, etc. Using such a CDM protection device arrangement, however, would protect against an ESD event on one die rather than on all dies. For example, if the active power clamp 231 on the first die 212 were to trigger in response to a detected ESD event, ESD charges 250 would not pass through the power clamp 232 of the second die 214 and would subsequently damage sensitive components in the 3DIC package 200 as indicated by the arrows. Thus, power clamps in different domains and dies cannot trigger simultaneously, and as illustrated in the aforementioned example, stored charges 250 in the VDD bus of the second die 214 cannot discharge to the VSS bus via its respective power clamp 232 (rather than through sensitive components) if only the power clamp 231 of the first die 212 triggers.

Figure 3A:
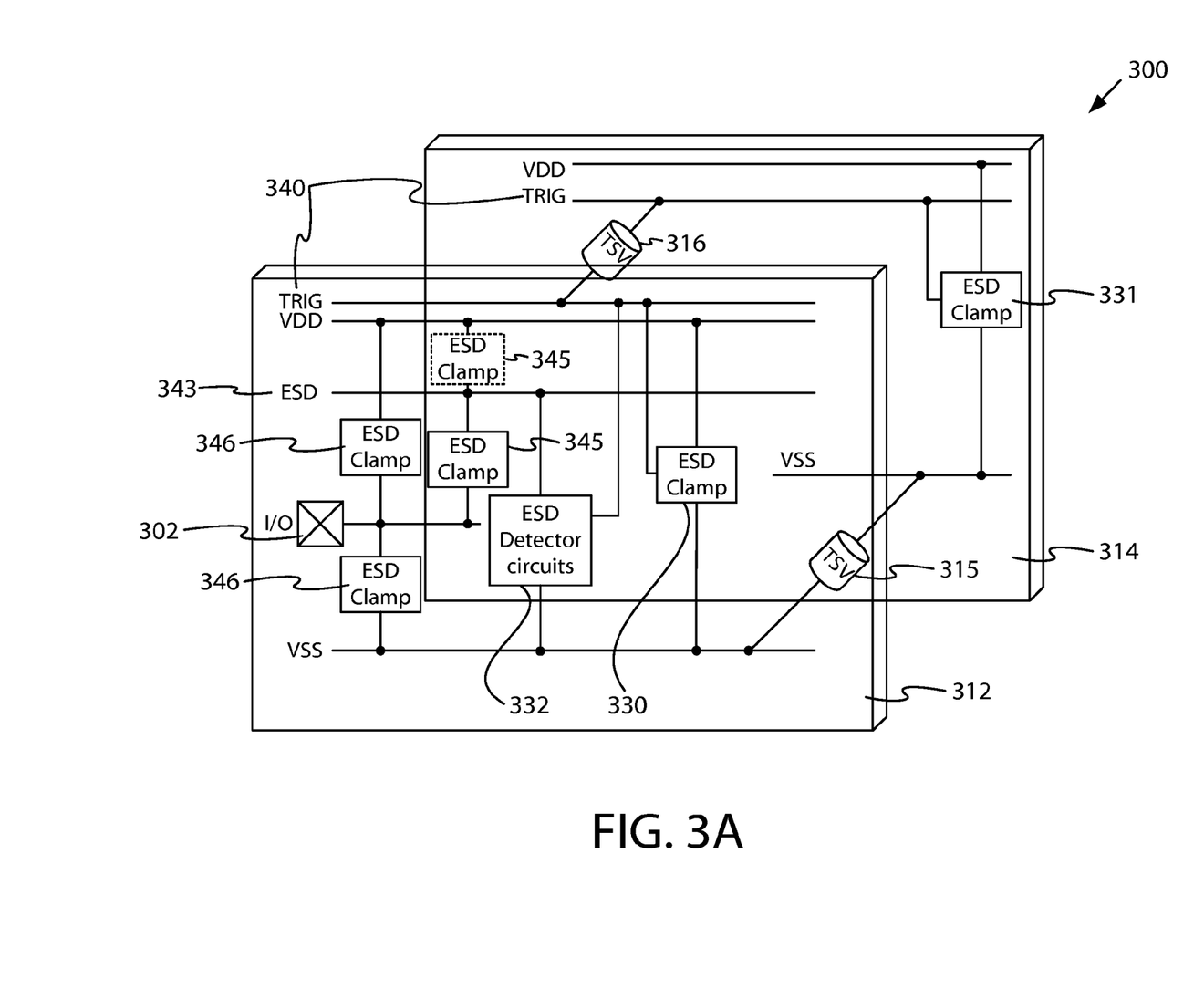
FIGS. 3A and 3B are schematic views of a three-dimensional integrated circuit package using three-dimensional integrated circuit electrostatic discharge protection according to embodiments of the disclosure.
Figure 3B:
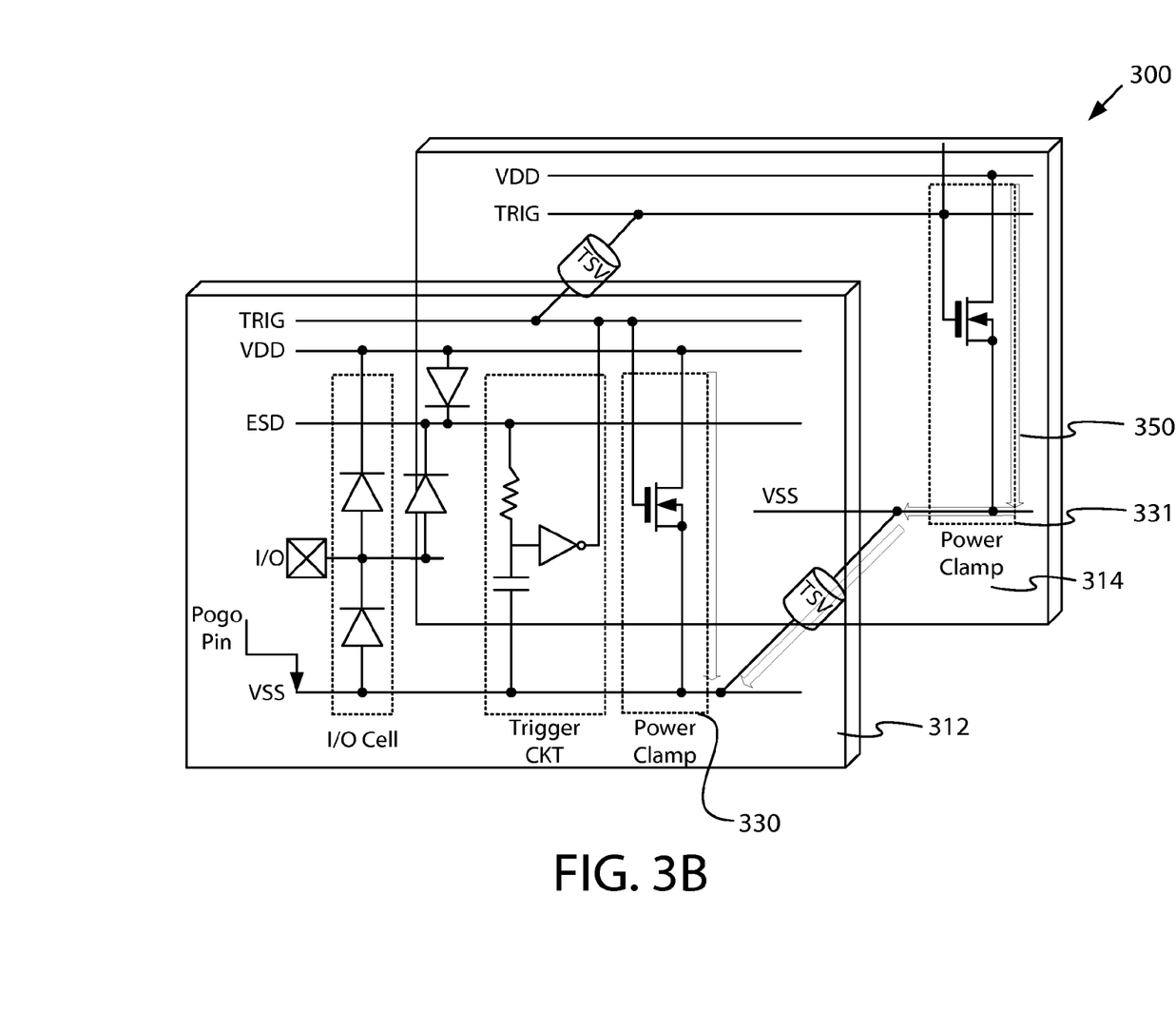

FIGS. 3A and 3B are schematic views of a 3DIC package using 3DIC ESD protection according to embodiments of the disclosure. More specifically, FIG. 3A is a schematic view of a 3DIC package using standard block depictions for components in the 3DIC package, and FIG. 3B is a schematic view of one embodiment of the 3DIC package of FIG. 3A illustrating exemplary, but non-limiting components in the 3DIC package. With reference to FIG. 3A, a 3DIC package 300 includes a first die 312 and a second die 314 having a common VSS bus and a common trigger bus 340. The common trigger bus 340 and VSS bus are interconnected between dies using TSVs 316, 315, respectively. Any number or type of components on the first and second dies 312, 314 can be included thereon and are not shown in FIG. 3A for simplicity purposes. The common trigger bus 340 is connected to ESD clamp cells 330, 331 and/or ESD detector circuits 332 that are present in the respective die. Thus, the common trigger bus 340 can control the supply of power (VDD, VSS) through the ESD clamp cells 330, 331 and protect each respective die 312, 314 from an ESD event. Using such an arrangement, the ESD power clamp cells 330, 331 in the 3DIC 300 can trigger at the same time to protect all internal devices, circuitry and components, including gate oxide devices.

In another embodiment, the 3DIC 300 includes a dedicated ESD bus 343. In such an embodiment, input and/or output pads 302 for each die or chip 312, 314 can include ESD clamp cells 345 to pull-up a voltage to a dedicated ESD bus 343 and additional ESD clamp cells 346 to pull down a voltage to VSS. Each chip or die 312, 314 can include an ESD detector circuit 332 between its respective ESD bus 343 and common VSS bus to provide an enable signal to the common trigger bus 340. Thus as illustrated in FIG. 3B, during an ESD event detected by or in any die 312, 314, ESD charges 350 can pass through the power clamp cells 330, 331 in the 3DIC 300 at the same time to protect all internal devices, circuitry and components, including gate oxide devices.

Figure 4:
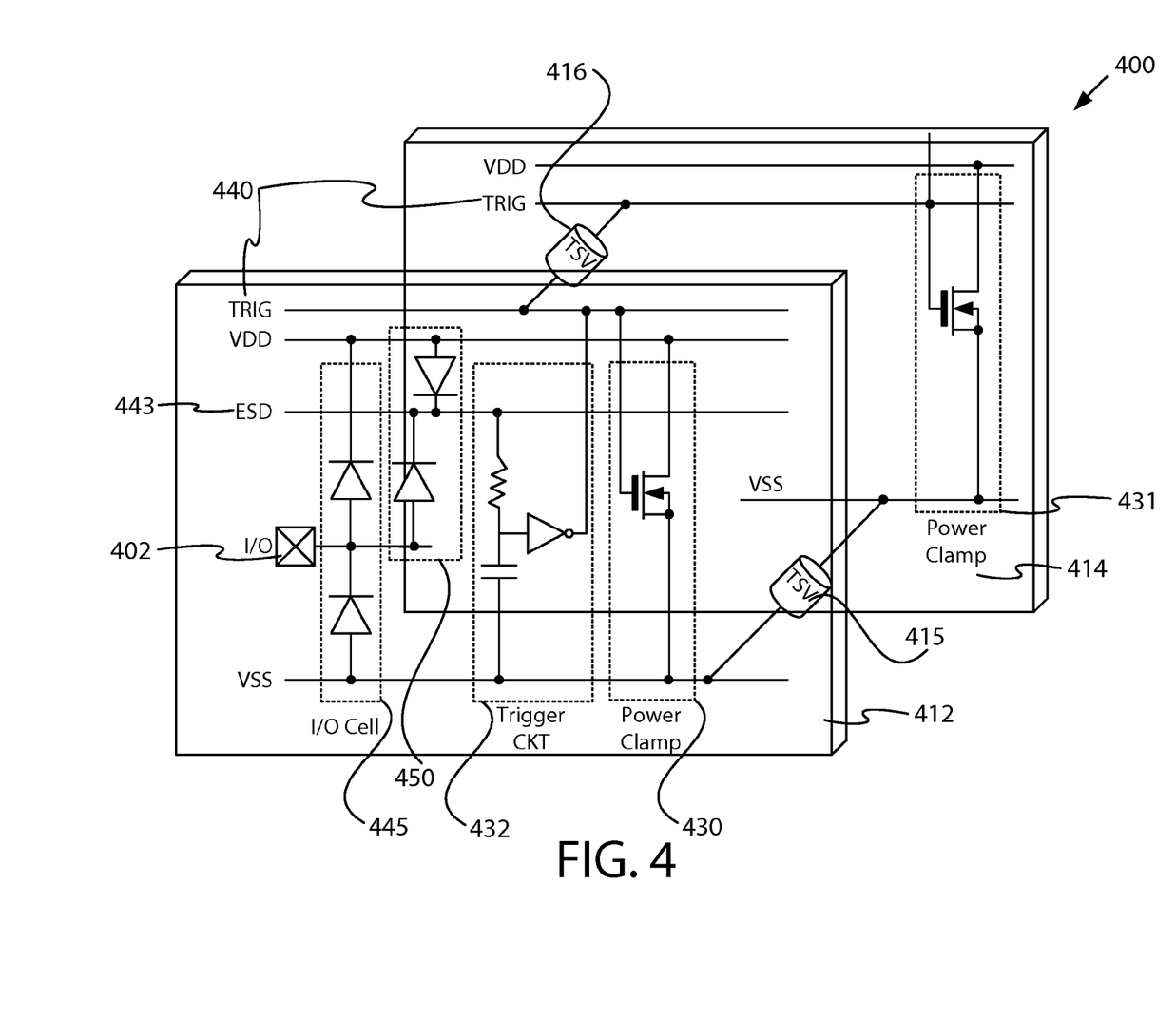
FIGS. 4-7 are schematic views of a three-dimensional integrated circuit packages using additional three-dimensional integrated circuit electrostatic discharge protection embodiments.

FIGS. 4-7 are schematic views of 3DIC packages using additional 3DIC ESD protection embodiments. FIG. 4 depicts one embodiment of a 3DIC package similar to that shown in FIG. 3 but without the illustrated ESD event. With reference to FIG. 4, a 3DIC package 400 includes first and second dies 412, 414 having a common VSS bus and a common trigger bus 440. The common trigger bus 440 and VSS bus are interconnected between dies using TSVs 416, 415, respectively. Any number or type of components on the first and second dies 412, 414 can be included thereon and are not shown in FIG. 4 for simplicity purposes. The common trigger bus 440 is connected to ESD clamp cells 430, 431 and/or ESD detector or trigger circuits 432 that are present in the respective die to provide an enable signal to the common trigger bus 340. In the illustrated embodiment, the ESD clamp cells 430, 431 include a NMOS transistor. Thus, the common trigger bus 440 can control the supply of power (VDD, VSS) through the ESD clamp cells 430, 431 and protect each respective die 412, 414 from an ESD event. In the illustrated embodiment, the trigger circuit 432 includes a resistor, capacitor and NOT gate. Using such an arrangement, the ESD power clamp cells 430, 431 in the 3DIC 400 can trigger at the same time to protect all internal devices, circuitry and components, including gate oxide devices. The 3DIC 400 includes a dedicated ESD bus 443. Input and/or output pads 402 for each die or chip 412, 414 can include Input/Output (I/O) clamp cells 445, 450 to pull-up a voltage to the dedicated ESD bus 443 and pull down a voltage to VSS. In the illustrated embodiment, the I/O clamp cell 445, 450 includes a series of diodes to pull up voltage to the dedicated ESD bus 443 and/or pull down voltage to VSS.

Figure 5:
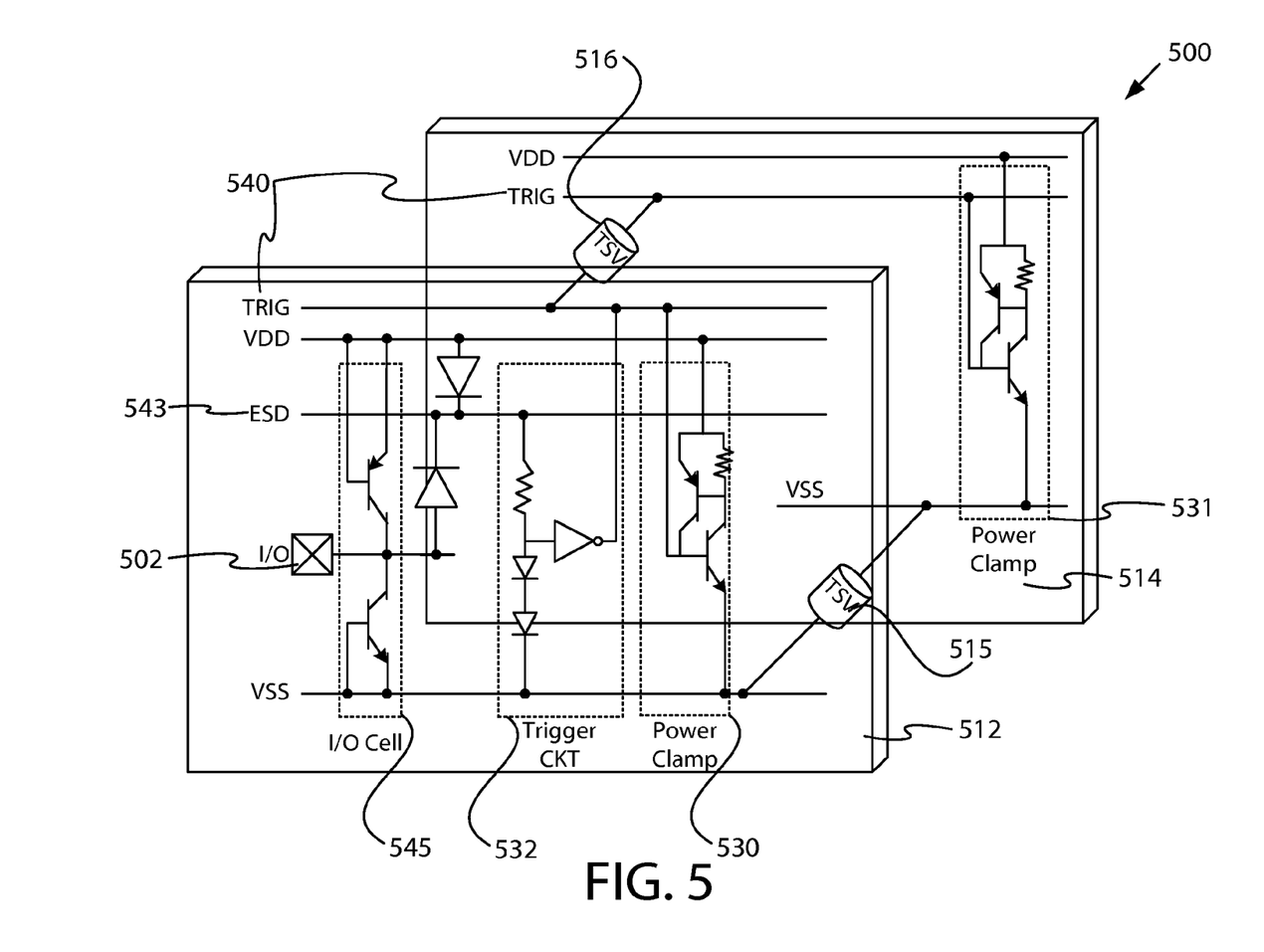

With reference to FIG. 5, a 3DIC package 500 includes first and second dies 512, 514 having a common VSS bus and a common trigger bus 540. The common trigger bus 540 and VSS bus are interconnected between dies using TSVs 516, 515, respectively. Any number or type of components on the first and second dies 512, 514 can be included thereon and are not shown in FIG. 5 for simplicity purposes. The common trigger bus 540 is connected to ESD clamp cells 530, 531 and/or ESD detector or trigger circuits 532 that are present in the respective die to provide an enable signal to the common trigger bus 540. In the illustrated embodiment, the ESD clamp cells 530, 531 include a series of bipolar transistors such as the depicted PNPN arrangement. Thus, the common trigger bus 540 can control the supply of power (VDD, VSS) through the ESD clamp cells 530, 531 and protect each respective die 512, 514 from an ESD event. In the illustrated embodiment, the trigger circuit 532 includes a series of diodes, resistor, and NOT gate. Using such an arrangement, the ESD power clamp cells 530, 531 in the 3DIC 500 can trigger at the same time to protect all internal devices, circuitry and components, including gate oxide devices. The 3DIC 500 includes a dedicated ESD bus 543. Input and/or output pads 502 for each die or chip 512, 514 can include I/O clamp cells 545 to pull-up a voltage to the dedicated ESD bus 543 and pull down a voltage to VSS. In the illustrated embodiment, the I/O clamp cell 545 includes a PNP bipolar transistor to pull up voltage to the dedicated ESD bus 543 and a NPN bipolar transistor to pull down voltage to VSS.

Figure 6:
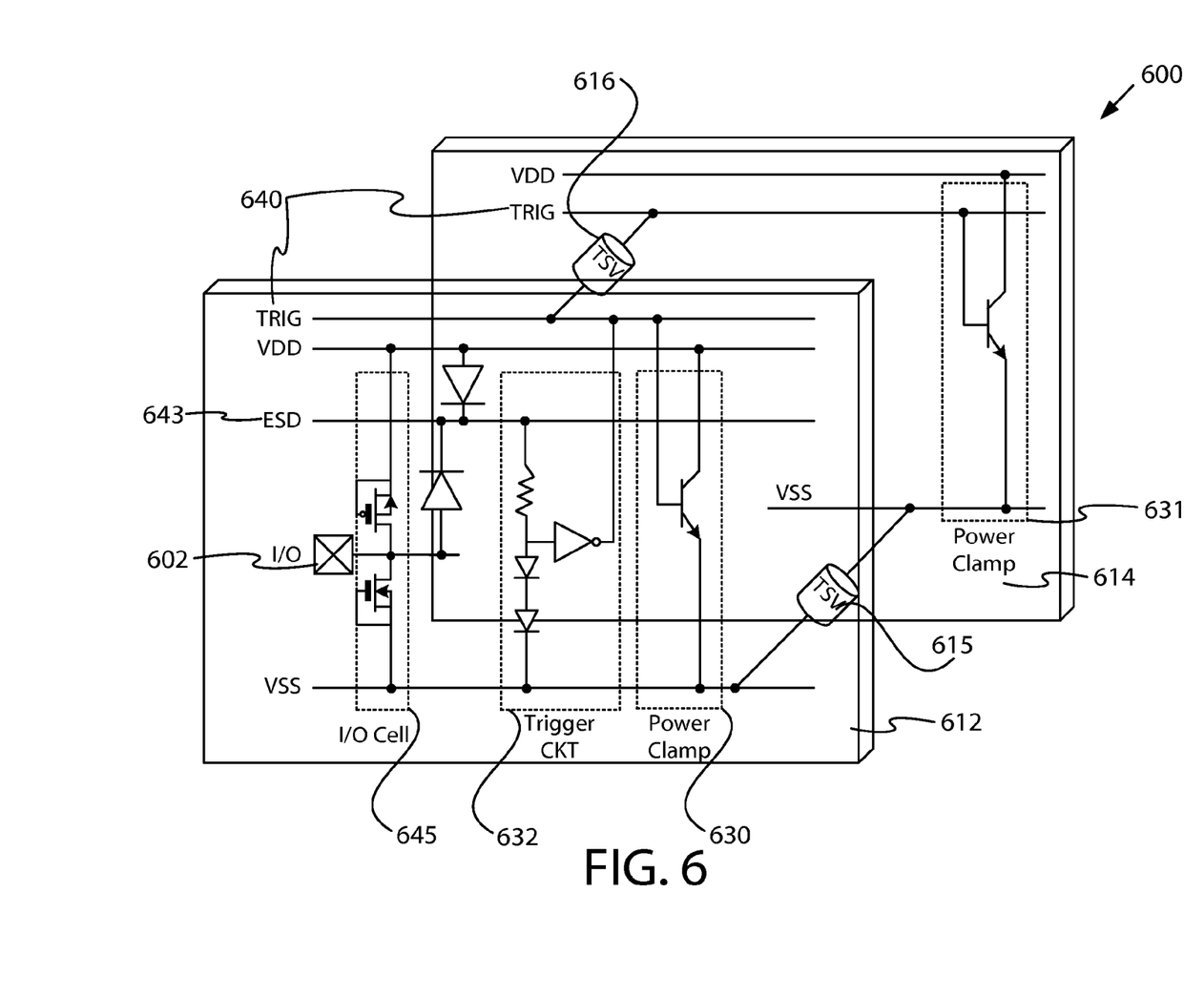

With reference to FIG. 6, a 3DIC package 600 includes first and second dies 612, 614 having a common VSS bus and a common trigger bus 640. The common trigger bus 640 and VSS bus are interconnected between dies using TSVs 616, 615, respectively. Any number or type of components on the first and second dies 612, 614 can be included thereon and are not shown in FIG. 6 for simplicity purposes. The common trigger bus 640 is connected to ESD clamp cells 630, 631 and/or ESD detector or trigger circuits 632 that are present in the respective die to provide an enable signal to the common trigger bus 640. In the illustrated embodiment, the ESD clamp cells 630, 631 include a NPN bipolar transistor. Thus, the common trigger bus 640 can control the supply of power (VDD, VSS) through the ESD clamp cells 630, 631 and protect each respective die 612, 614 from an ESD event. In the illustrated embodiment, the trigger circuit 632 includes a series of diodes, resistor, and NOT gate. Using such an arrangement, the ESD power clamp cells 630, 631 in the 3DIC 600 can trigger at the same time to protect all internal devices, circuitry and components, including gate oxide devices. The 3DIC 600 includes a dedicated ESD bus 643. Input and/or output pads 602 for each die or chip 612, 614 can include I/O clamp cells 645 to pull-up a voltage to the dedicated ESD bus 643 and pull down a voltage to VSS. In the illustrated embodiment, the I/O clamp cell 645 includes a PMOS transistor to pull up voltage to the dedicated ESD bus 643 and a NMOS transistor to pull down voltage to VSS.

Figure 7:
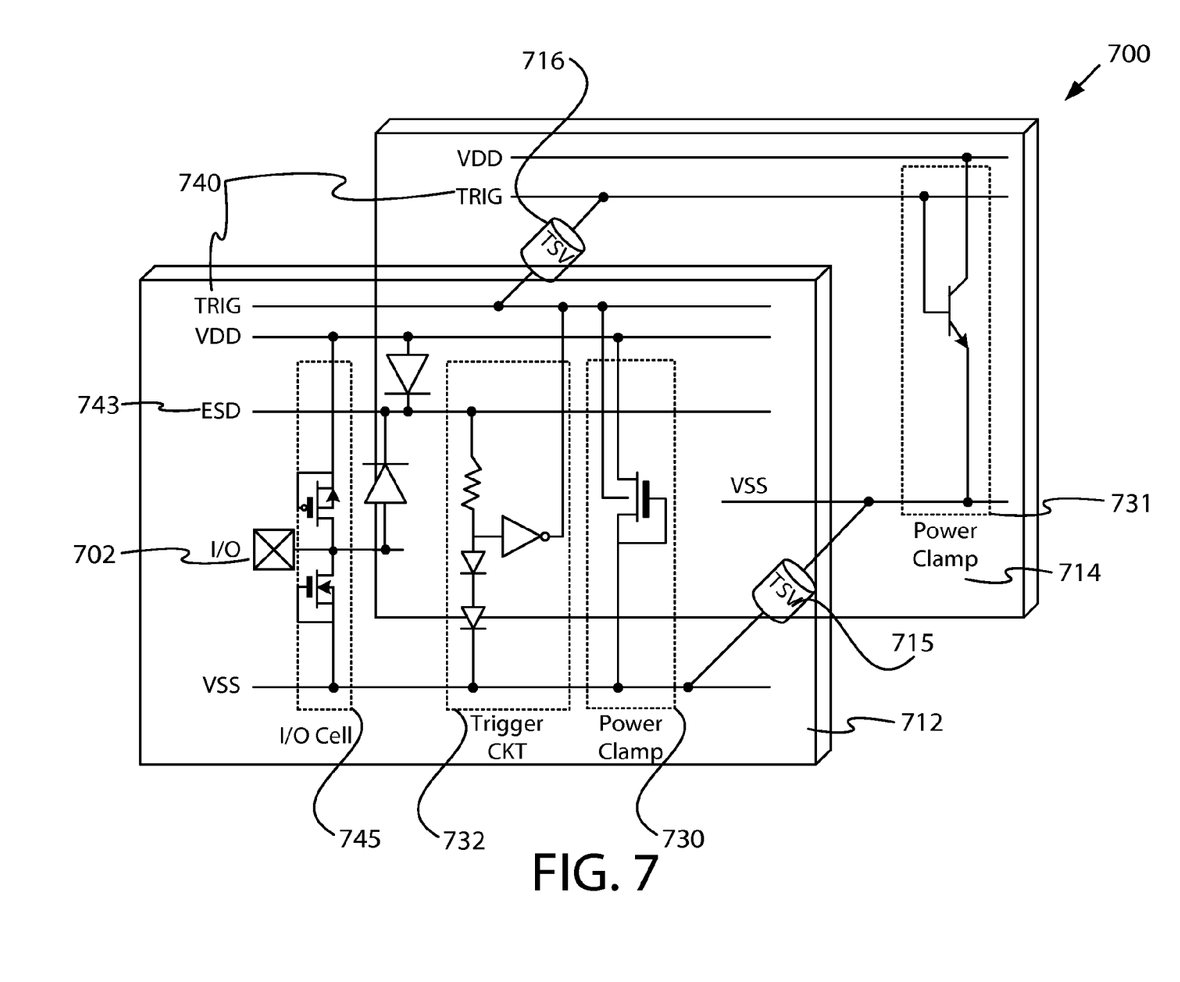

With reference to FIG. 7, a 3DIC package 700 includes first and second dies 712, 714 having a common VSS bus and a common trigger bus 740. The common trigger bus 740 and VSS bus are interconnected between dies using TSVs 716, 715, respectively. Any number or type of components on the first and second dies 712, 714 can be included thereon and are not shown in FIG. 7 for simplicity purposes. The common trigger bus 740 is connected to ESD clamp cells 730, 731 and/or ESD detector or trigger circuits 732 that are present in the respective die to provide an enable signal to the common trigger bus 740. In the illustrated embodiment, the ESD clamp cells 730, 731 include a NMOS transistor and a NPN bipolar transistor, respectively. Thus, the common trigger bus 740 can control the supply of power (VDD, VSS) through the ESD clamp cells 730, 731 and protect each respective die 712, 714 from an ESD event. In the illustrated embodiment, the trigger circuit 732 includes a series of diodes, resistor, and NOT gate. Using such an arrangement, the ESD power clamp cells 730, 731 in the 3DIC 700 can trigger at the same time to protect all internal devices, circuitry and components, including gate oxide devices. The 3DIC 700 includes a dedicated ESD bus 743. Input and/or output pads 702 for each die or chip 712, 714 can include I/O clamp cells 745 to pull-up a voltage to the dedicated ESD bus 743 and pull down a voltage to VSS. In the illustrated embodiment, the I/O clamp cell 745 includes a PMOS transistor to pull up voltage to the dedicated ESD bus 643 and a NMOS transistor to pull down voltage to VSS.

It should be noted that while several different ESD protection schemes have been illustrated and described herein, such a description should not limit the scope of the claims appended herewith as ESD protection schemes and/or devices and equivalent circuits according to embodiments herein can include diode based devices, RC based devices, transistor based devices, silicon-controller rectifiers, PNP transistors, NPN transistors, NMOS transistors, PMOS transistors, field oxide devices, gate triggered devices, base triggered devices, substrate triggered devices, zener diodes, metal oxide varistors, transient voltage suppression diodes, complementary metal oxide semiconductors (CMOSs), bipolar clamp diodes, and combinations thereof.

In one embodiment, an ESD protection arrangement is provided which includes a trigger line common to each die in a 3DIC, the trigger bus controlling the power of a power clamp in each die. In one embodiment, the trigger line is connected to each die in the 3DIC using a TSV. The arrangement also includes an ESD line specific to each die in the 3DIC and an ESD detection circuit connected to the ESD line and to a first power line. When an input signal is received by the ESD detection circuit, the ESD detection circuit provides an output signal to the trigger line to supply power to the power clamp in each die. In one embodiment, the input signal correlates to an ESD event in one of the dies in the three dimensional integrated circuit. In another embodiment, the arrangement includes an I/O pad coupled to the first power line, a second power line, and the ESD line via an I/O cell to pull up voltage to the second power line or ESD line or pull down voltage to the first power line. The I/O cell, ESD detection circuit, and/or power clamps can include exemplary devices such as, but not limited to, diode based devices, RC based devices, transistor based devices, silicon-controller rectifiers, PNP transistors, NPN transistors, NMOS transistors, PMOS transistors, field oxide devices, gate triggered devices, base triggered devices, substrate triggered devices, zener diodes, metal oxide varistors, transient voltage suppression diodes, CMOSs, bipolar clamp diodes, and combinations thereof.

In another embodiment, a 3DIC is provided having a plurality of dies each die including a trigger line common to the other dies, a dedicated ESD line for each respective die, and an ESD detection circuit connected to the dedicated ESD line and to a first power line common to the other dies. The trigger line controls the power of a power clamp in each respective die. In one embodiment, the trigger line is connected to each die in the 3DIC using a TSV. When an input signal is received by the ESD detection circuit of one of the plural dies, the ESD detection circuit generates an output signal to the common trigger line to supply power to the power clamp in each of the plural dies to clamp ESD voltage or current to the common first power line or a second power line. In one embodiment, each of the plural dies further includes an I/O pad coupled to the common first power line, the second power line, and the ESD line via an I/O cell to pull up voltage to the second power line or ESD line or pull down voltage to the common first power line. The I/O cell, ESD detection circuit, and/or power clamps can include exemplary devices such as, but not limited to, diode based devices, RC based devices, transistor based devices, silicon-controller rectifiers, PNP transistors, NPN transistors, NMOS transistors, PMOS transistors, field oxide devices, gate triggered devices, base triggered devices, substrate triggered devices, zener diodes, metal oxide varistors, transient voltage suppression diodes, CMOSs, bipolar clamp diodes, and combinations thereof. In another embodiment, one or more of the ESD detection circuits in the dies are different.

Figure 10:
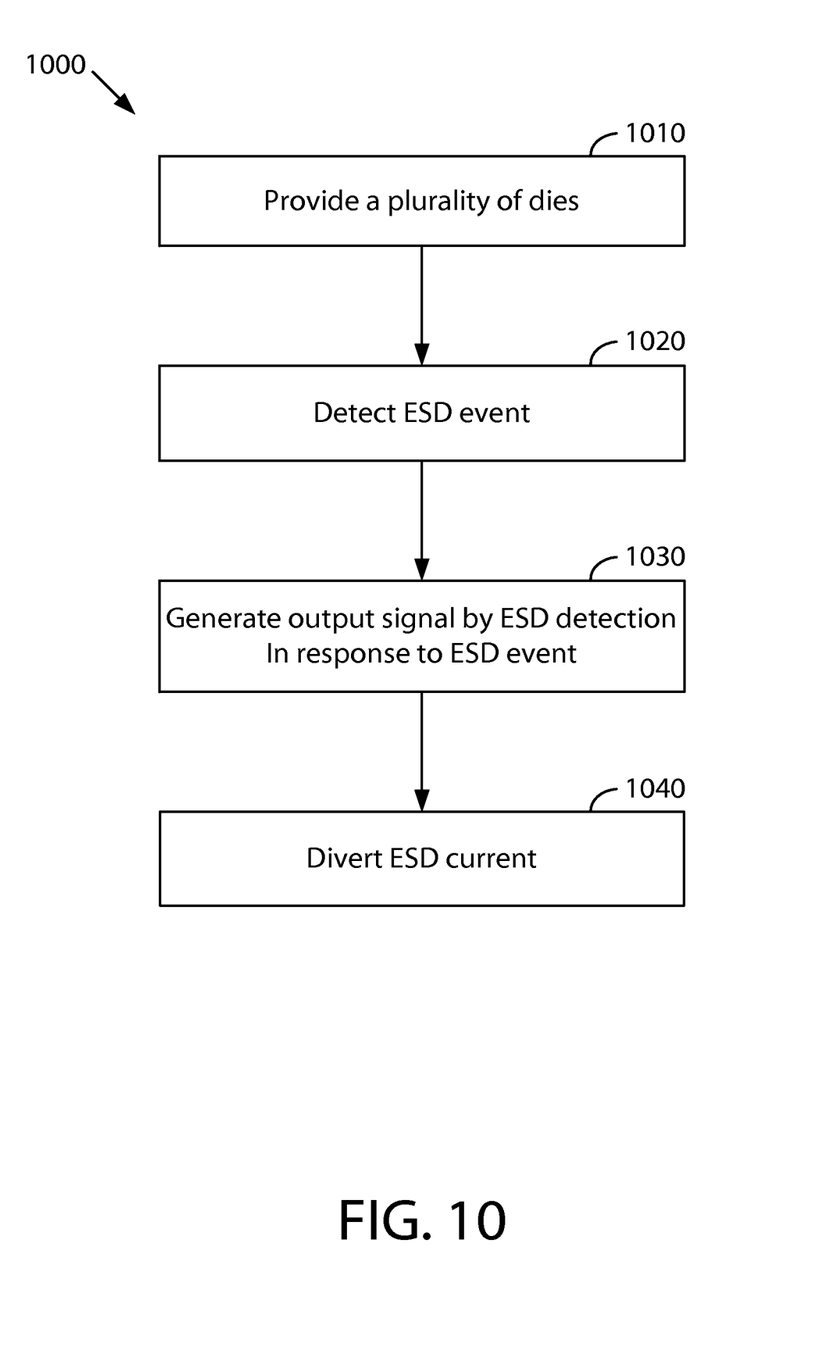
FIG. 10 is a block diagram of method of protecting a three-dimensional integrated circuit from an electrostatic discharge event.

FIG. 10 is a block diagram of method of protecting a 3DIC from an ESD event. With reference to FIG. 10, the method 1000 includes providing a plurality of dies at step 1010 each die having a trigger line common to the other dies, a dedicated ESD line, and an ESD detection circuit coupled to the ESD line and to a first power line common to the other dies. The trigger line controls the power of a power clamp in each respective die. At step 1020, an ESD event can be detected on one of the plural dies by the ESD detection circuit, and at step 1030 an output signal is generated by the ESD detection circuit in response to the ESD event. At step 1040, ESD voltage is diverted from sensitive components on the 3DIC in response to the generated output signal. In one embodiment, step 1030 further includes providing an output signal to the common trigger line to supply power to the power clamp in each of the plural dies, and step 1040 further includes clamping ESD voltage or current to the common first power line or a second power line using one or more power clamps. In another embodiment, each of the plural dies further includes an I/O pad coupled to the common first power line, the second power line, and the ESD line via an I/O cell. In the embodiment having an I/O pad and I/O cell described above, step 1040 can include pulling down voltage to the common first power line using the I/O cell, pulling up voltage to the second power line using the I/O cell, or pulling up voltage to the ESD line using the I/O cell.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-10, an electrostatic discharge protection device for a three dimensional integrated circuit has been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. An electrostatic discharge (ESD) protection arrangement comprising:
   a trigger line common to each die in a three dimensional integrated circuit, the three dimensional circuit including a first die disposed over and coupled to at least one second die, the first die being coupled to the at least one second die by at least one through-substrate via;
   an ESD line specific to each die in the three dimensional integrated circuit; and
   an ESD detection circuit connected to the ESD line and to a first power line,
   wherein when an input signal is received by the ESD detection circuit, the ESD detection circuit is configured to provide an output signal to the trigger line to control a power clamp in each die.

2. The ESD protection arrangement of claim 1 wherein the input signal correlates to an ESD event in one of the dies in the three dimensional integrated circuit.

3. The ESD protection arrangement of claim 1 further comprising an input/output (I/O) pad coupled to the first power line, a second power line, and the ESD line via an I/O cell to pull up voltage to the second power line or ESD line or pull down voltage to the first power line.

4. The ESD protection arrangement of claim 3 wherein the I/O cell includes a device selected from the group consisting of a diode based device, an RC based device, a transistor based device, a silicon-controller rectifier, a PNP transistor, a NPN transistor, a re-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

5. The ESD protection arrangement of claim 1 wherein the ESD detection circuit includes a device selected from the group consisting of diode based device, an RC based device, a transistor based device, a silicon-controller rectifier, a PNP transistor, a NPN transistor, a n-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

6. The ESD protection arrangement of claim 1 wherein the power clamp includes a device selected from the group consisting of a diode based device, an RC based device, a transistor based device, a silicon-controller rectifier, a PNP transistor, a NPN transistor, a n-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

7. The ESD protection arrangement of claim 1 wherein the trigger line is connected to each die in the three dimensional integrated circuit using the through-substrate via.

8. A three dimensional integrated circuit comprising:
a plurality of dies each die having:
a trigger line common to the other dies,
a dedicated electrostatic discharge (ESD) line for each respective die, and
an ESD detection circuit connected to the dedicated ESD line and to a first power line common to the other dies,
wherein when an input signal is received by the ESD detection circuit of one of the plural dies, the ESD detection circuit is configured to generate an output signal to the common trigger line to control a power clamp in each of the plural dies to clamp an ESD event to the common first power line or a second power line.

9. The three dimensional integrated circuit of claim 8 wherein each of the plural dies further include:
an input/output (I/O) pad coupled to the common first power line, the second power line, and the ESD line via an I/O cell to pull up voltage to the second power line or ESD line or pull down voltage to the common first power line.

10. The three dimensional integrated circuit of claim 9 wherein the I/O cell includes a device selected from the group consisting of a diode based device, an RC based device, a transistor based device, a silicon-controller rectifier, a PNP transistor, a NPN transistor, a n-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

11. The three dimensional integrated circuit of claim 8 wherein the ESD detection circuit includes a device selected from the group consisting of a diode based device, an RC based device, a transistor based device, a silicon-controller rectifier, a PNP transistor, a NPN transistor, a n-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

12. The three dimensional integrated circuit of claim 8 wherein the power clamp includes a device selected from the group consisting of a diode based device, an RC based device, a transistor based device, a silicon-controller rectifier, a PNP transistor, a NPN transistor, a n-channel metal oxide transistor, a p-channel metal oxide transistor, a field oxide device, a gate triggered device, a base triggered device, a substrate triggered device, a zener diode, a metal oxide varistor, a transient voltage suppression diode, a complementary metal oxide semiconductor, a bipolar clamp diode, and combinations thereof.

13. The three dimensional integrated circuit of claim 8 wherein the trigger line is connected to each die using a through-substrate via.

14. The three dimensional integrated circuit of claim 8 wherein the one or more of the ESD detection circuits in the dies are different.

15. A method of protecting a three dimensional integrated circuit from an electrostatic discharge (ESD) event comprising the steps of:
providing a plurality of dies each die having:
a trigger line common to the other dies, the trigger line controlling the power of a power clamp in each respective die,
a dedicated ESD line, and
an ESD detection circuit coupled to the ESD line and to a first power line common to the other dies,
detecting an ESD event on one of the plural dies by the ESD detection circuit;
generating an output signal by the ESD detection circuit in response to the ESD event; and
diverting the ESD event in response to the generated output signal.

16. The method of claim 15 wherein the step of generating an output signal further comprises providing an output signal to the common trigger line to supply power to the power clamp in each of the plural dies, and
wherein step of diverting further comprises clamping the ESD event to the common first power line or a second power line using one or more power clamps.

17. The method of claim 15 wherein each of the plural dies further includes an input/output (I/O) pad coupled to the common first power line, the second power line, and the ESD line via an I/O cell.

18. The method of claim 17 wherein the step of diverting further includes pulling down voltage to the common first power line using the I/O cell.

19. The method of claim 17 wherein the step of diverting further includes pulling up voltage to the second power line using the I/O cell.

20. The method of claim 17 wherein the step of diverting further includes pulling up voltage to the ESD line using the I/O cell.

* * * * *

UNITED STATES PATENT AND TRADEMARK OFFICE
CERTIFICATE OF CORRECTION

PATENT NO. : 9,172,242 B2  
APPLICATION NO. : 13/667072  
DATED : October 27, 2015  
INVENTOR(S) : Tzu-Heng Chang et al.

Page 1 of 1

It is certified that error appears in the above-identified patent and that said Letters Patent is hereby corrected as shown below:

IN THE CLAIMS:

Claim 4, Column 8, Line 43, delete "re-channel" and insert -- n-channel --

Signed and Sealed this  
Seventh Day of June, 2016

Michelle K. Lee  
*Director of the United States Patent and Trademark Office*